US005878074A

United States Patent [19]

Buchanan et al.

[11] Patent Number: 5,878,074

[45] Date of Patent: Mar. 2, 1999

[54] EVAPORATOR CRUCIBLE AND IMPROVED METHOD FOR PERFORMING ELECTRON-BEAM EVAPORATION

[75] Inventors: Barry S. Buchanan, Mohnton; Frances Deemer, Wernersville; Lloyd G. Walton, Reading, all of Pa.

[73] Assignee: Lucent Technologies Inc., Murray Hill, N.J.

[21] Appl. No.: 904,098

[22] Filed: Jul. 31, 1997

[51] Int. Cl.[6] .................... H01J 37/305

[52] U.S. Cl. .................... 373/11; 373/15; 219/420

[58] Field of Search .................... 373/10, 11, 15–17, 373/71, 72, 73, 75; 219/420, 421

[56] References Cited

U.S. PATENT DOCUMENTS

| | | | |
|---|---|---|---|
| 2,635,579 | 4/1953 | Chadsey, Jr. | 373/11 |
| 3,364,296 | 1/1968 | Smith, Jr. | 373/11 |
| 3,879,022 | 4/1975 | Aichert | 373/11 |
| 4,131,753 | 12/1978 | Tsujimoto et al. | 373/11 |
| 4,641,764 | 2/1987 | Faulkner, III | 219/421 |
| 5,139,236 | 8/1992 | Mankins | 373/7 |

*Primary Examiner*—Tu Ba Hoang
*Attorney, Agent, or Firm*—Mathews, Collins, Shepherd & Gould, P.A.

[57] ABSTRACT

A crucible is disclosed for use in coating a substrate with deposition materials by electron-beam evaporation. The crucible is configured to be inserted into an evaporator pot; it has a bottom and at least one sidewall extending upwardly from the bottom and terminating in a rim, such that the bottom and sidewall define a reservoir for containing the deposition material, and the rim defines a mouth out of which the deposition material may evaporate. A lip extends upwardly from a predetermined section of the rim which shields the spattering of deposition of material onto the evaporator pot during the evaporation process. A improved method is also disclosed for performing electron-beam evaporation with the present invention crucible.

15 Claims, 4 Drawing Sheets

EVAPORATOR CRUCIBLE AND IMPROVED METHOD FOR PERFORMING ELECTRON-BEAM EVAPORATION

FIELD OF THE INVENTION

The present invention relates to a crucible for use in an electron-beam evaporator and, more particularly, to a crucible having a rim with a lip that extends upwardly from a predetermined section of the rim and prevents the spattering of the crucible contents during the evaporation process. The invention further involves an improved method for performing electron-beam evaporation using the crucible herein disclosed.

BACKGROUND OF THE INVENTION

Methods of performing electron-beam evaporation are well known, and the use of crucible inserts in seeking to optimize the efficiency of such processes is also well known. Electron-beam evaporation is used to apply a coating of a deposition material to a substrate. The deposition material often is comprised of metal or intermetallic compounds, such as gold, silver, copper, or aluminum. Generally, the deposition material is placed in a reservoir or evaporator pot having an opening or mouth, and the substrate to be coated is placed adjacent the mouth. A beam of electrons is directed into the reservoir, causing the deposition material to evaporate out of the mouth and adhere to the substrate.

When a crucible is used, the deposition material is placed in the crucible, the crucible is inserted into the evaporator pot, and the electron beams are directed into the crucible. When a crucible is properly selected, it can reduce the time it takes for the deposition material to evaporate onto the substrate. Also, if one wants to change the deposition material being evaporated, the crucible can simplify this process, because one can simply change the crucible (and evaporation materials) without having to change or clean the entire evaporator pot. Therefore, crucibles have proved advantageous to the electron-beam evaporation process.

However, when prior art crucibles are used, deposition material often spatters onto the evaporator pot or the lining of the evaporator. The spattered material can result in the buildup of residue on the evaporator pot that requires cleaning or chipping from time to time. This cleaning process requires a downtime during which the evaporator cannot be used, thereby reducing its efficiency. This spattering and excessive coating is more fully explained, below, with reference to the drawings and more particularly FIGS. 1A and 1B.

The present invention is, therefore, addressed to providing an improved crucible that eliminates or reduces the spattering of deposition material during the evaporation process, as well as an improved method of performing electron-beam evaporation that results in reduced spattering. The invention provides advantages in that it eliminates or reduces the need to clean the evaporator pot, minimizes waste of the deposition materials, improves the efficiency of the system, and also provides a crucible that is easier for a user to handle. Further advantages may be revealed to one skilled in the art following from the description detailed below.

SUMMARY OF THE INVENTION

Summarily described, the invention embraces a crucible to be inserted into an evaporator pot for use in coating a substrate with a deposition material through electron-beam evaporation, the crucible having a bottom and at least one sidewall extending upwardly from the bottom and terminating in a rim. The bottom and sidewall define a reservoir for containing the deposition material, and the reservoir further has a mouth for evaporation of the deposition material. A lip extends upwardly from a predetermined section of the rim to a predetermined height sufficient to shield the spattering of deposition material onto the evaporator pot during the evaporation process.

The invention further embraces a method of coating a substrate with deposition material using electron-beam evaporation in which a crucible having such a lip is used. With this method, the deposition material is placed within the crucible reservoir; the crucible is placed in the evaporator pot; the substrate is placed adjacent the reservoir mouth; and electrons are beamed at the deposition material at an acute angle relative to the bottom of the crucible and in the direction of the lip so that the deposition material spatters toward the lip and is prevented by the lip from being deposited onto the evaporator pot.

BRIEF DESCRIPTION OF THE DRAWINGS

For a better understanding of the invention, an exemplary embodiment is described below, considered together with the accompanying drawings, in which.

DETAILED DESCRIPTION OF THE INVENTION

The invention finds utility in any process of electron-beam evaporation. However, it is particularly useful with regard to electron-beam evaporation involving the coating of substrates with metals and especially heavy metals. Thus, the invention will be described in detail below with regard to metal evaporation, with it being understood that the invention finds utility when other deposition materials are used as well.

Figure 1A:
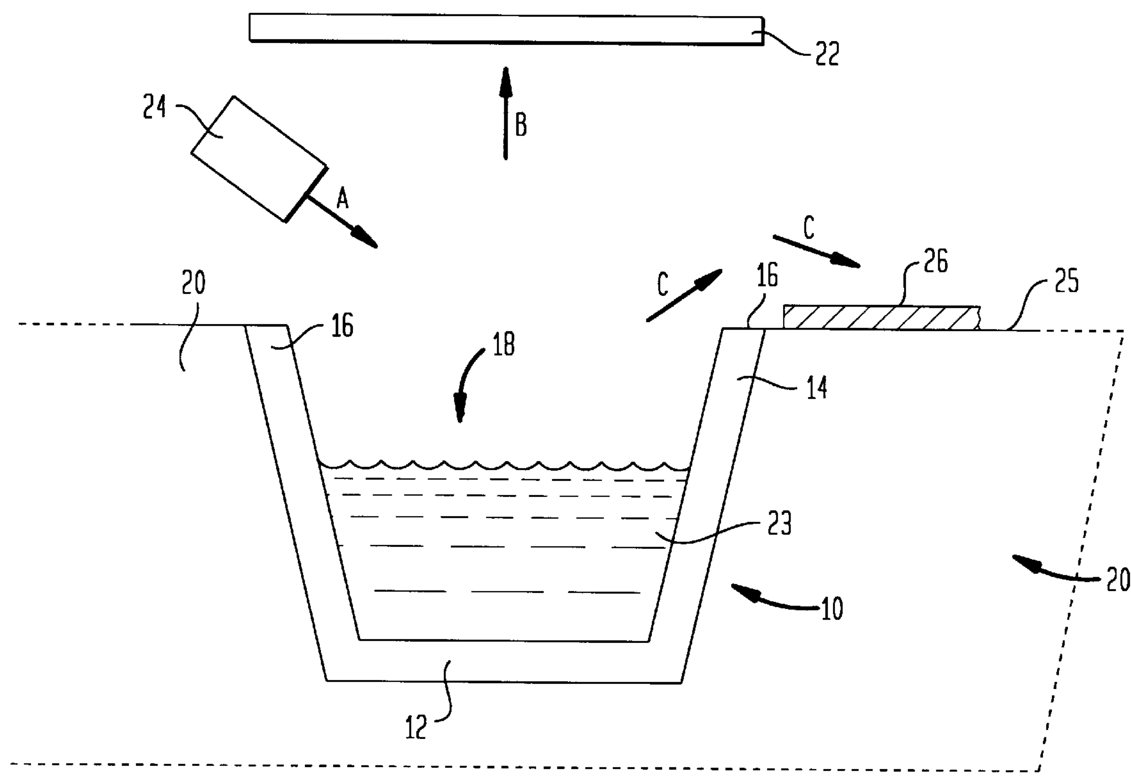
FIG. 1A shows a cross-sectional sideview of a prior art crucible used in an electron-beam evaporation process.

Referring to FIG. 1A, there is shown a cross-sectional view of a prior art crucible 10, as used in an electron-beam evaporation process. The crucible is cup-shaped, having a bottom surface 12, a cylindrical sidewall 14, and an upper rim 16, which define an inner reservoir 18.

Figure 1B:
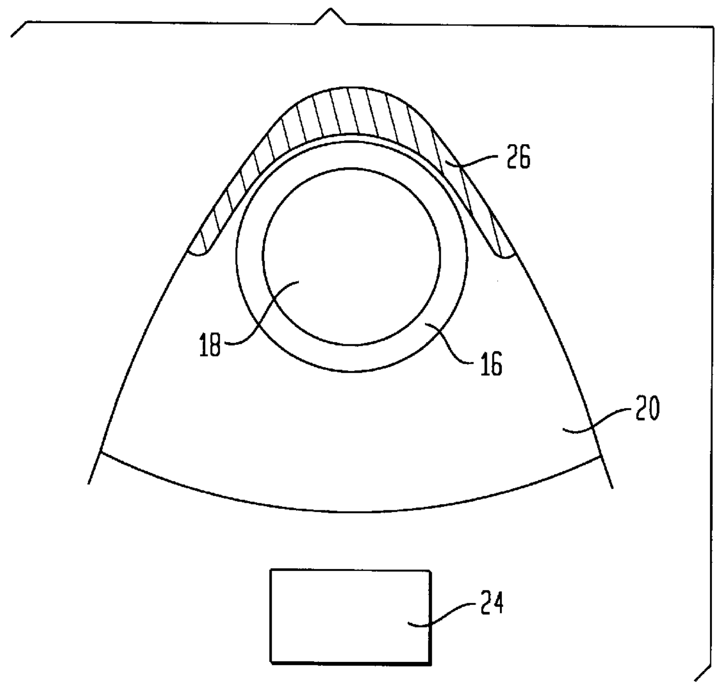
FIG. 1B shows a top view of a prior art crucible used in electron-beam evaporation.

FIGS. 1A and 1B illustrate the coating problem that has existed with the prior art. For example, the crucible is inserted into an evaporator pot 20. A substrate 22, which is to be coated, is placed above the reservoir 18. The metal 23 to be deposited on the substrate 22 is placed in the reservoir. An electron gun 24 is disposed above and aimed at the reservoir 18, and then it is activated, shooting a beam of electrons in the direction of arrow A into the metal 24 in the reservoir 18. The electrons cause the metal atoms to evaporate in the direction of arrow B to coat the surface of the substrate 22.

However, during this process which is well known in the prior art, the electron beam also causes metal atoms to spatter in the direction of arrow C, thereby coating the top surface 25 of the evaporator pot 20 with an unwanted layer of metal 26. Especially after repeated uses of the evaporator, this layer 26 tends to increase in depth. Also, one advantage of using the crucible, as discussed above, is that one can readily change the deposition materials being evaporated by changing the crucible. However, a drawback of changing prior art crucibles is that the layer 26 may then comprise a variety of metal or chemical materials that may react with each other or the crucible. The layer 26 must therefore be regularly removed not only to ensure the general cleanliness of the equipment, but also to ensure that unwanted metals or chemicals do not react, contaminate the crucible 10, the deposition metal 23, or the substrate 22. This cleaning process requires downtime and causes inefficiencies.

Figure 2A:
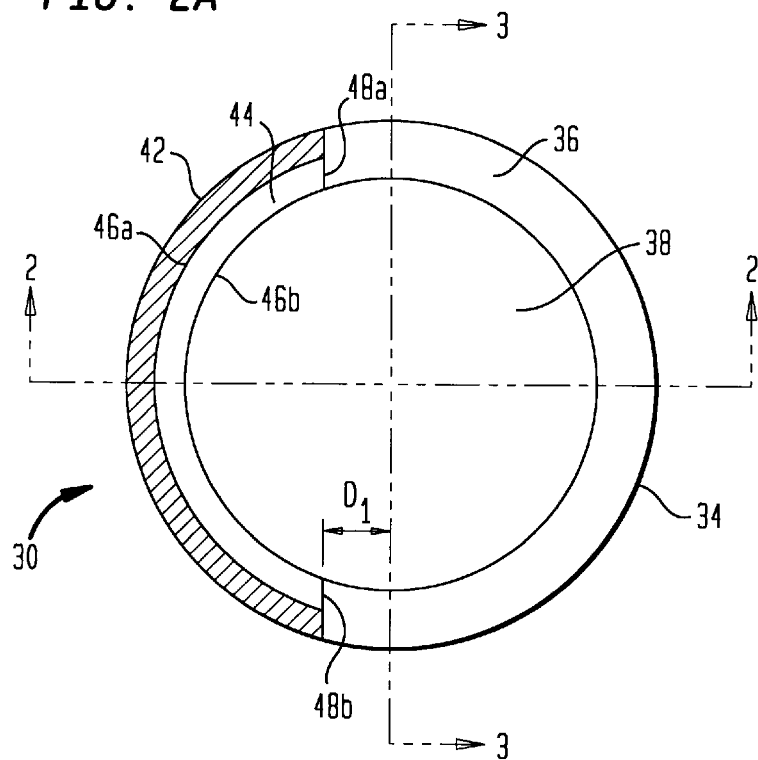
FIG. 2A shows a top view of a preferred embodiment of the present invention crucible.
Figure 2B:
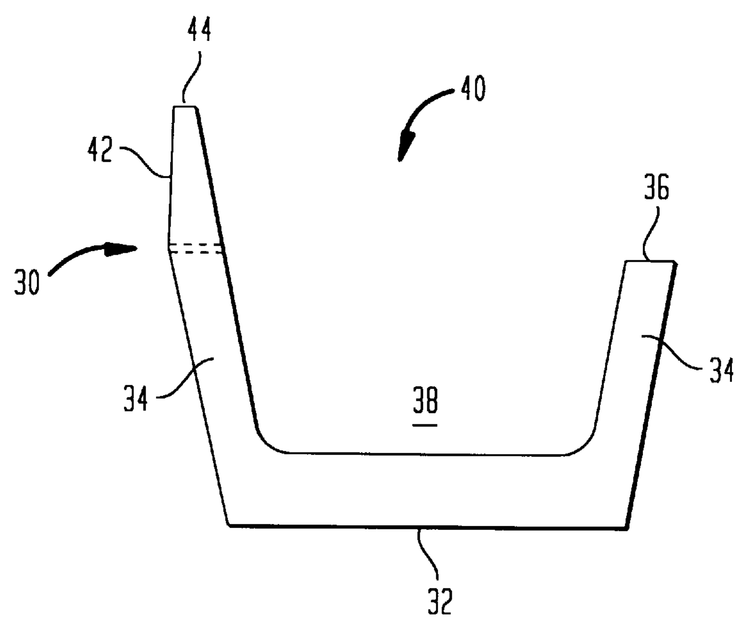
FIG. 2B shows a cross-sectional side view of the present invention crucible taken along the line 2—2 of FIG. 2A.

Referring to FIG. 2A, there is shown a top view of a preferred embodiment of the present invention crucible 30, configured to avoid the excess coating problem resulting from the use of prior art crucibles, discussed above. FIG. 2B shows a cross-sectional side view taken along line 2—2 of FIG. 2A.

Figure 2C:
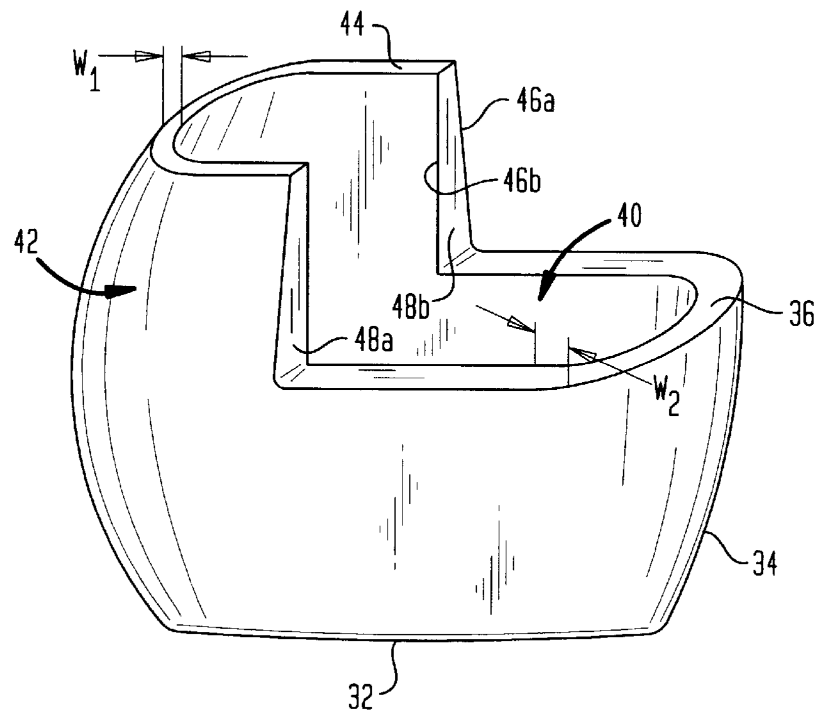
FIG. 2C shows a three-dimensional view of the present invention crucible.

Referring concomitantly to FIGS. 2A, 2B, and 2C, the crucible 30 is shown having a bottom 32 and a sidewall 34 projecting upwardly from the bottom 32. The sidewall 34 terminates in a rim 36. The bottom 32 and sidewall 34 define a cup-like reservoir 38, having a mouth 40 which provides an opening into the crucible. Although the crucible is shown with a circular bottom, a substantially cylindrical or frustroconical side wall, and a circular rim, thereby defining a cup-like crucible, it should be understood that other configurations may be used as well. For example, the crucible may be coned-shaped or rectangular in shape. The bottom need not comprise a flat surface, but may be rounded, and more than one sidewall may be used. A consideration in configuring the outer dimensions of the crucible is that the crucible be adapted to fit within the evaporator pot.

A lip 42 extends upwardly from a predetermined section of the rim 36. In FIGS. 2A and 2C, it is shown that the lip 42 extends upwardly from and thereby covers less than half of the total surface area of the rim, which is preferred. However, the lip 42 may cover more or less of the rim, provided a mouth 40 is retained sufficient in size to allow the passage of a beam of electrons into the reservoir 38. The lip 42 may be integrally molded to the rim 36, or it may take the form of a separate piece attachable to the crucible rim so that prior art crucibles may be converted into crucibles of the present invention.

Referring to FIGS. 2A and 2C, the lip 42 is shown having an upper C-shaped ridge 44, an outer lip sidewall 46*a*, an inner lip sidewall 46*b*, and two substantially rectangular side edges 48*a*, 48*b*. The outer lip sidewall 46*a* bends inwardly toward the center of the crucible 30, whereas the inner lip sidewall 46*b* projects upwardly and substantially perpendicular to the bottom surface 32, so that the width W1 of the lip ridge 44 is substantially less than the width W2 of the rim 36, as will be further explained below with reference to FIG. 2D. However, other configurations for the lip may be used as well. For example, the lip could be a U-shaped lip, covering a greater section of the rim perimeter, or it could take the form of a half-dome with a curved upper ridge, rather than a top ridge with a substantially flat surface.

Figure 2D:
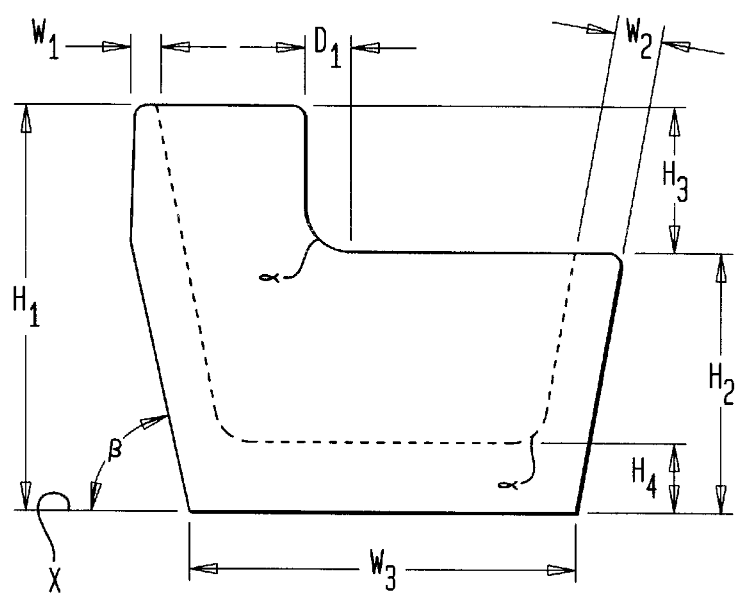
FIG. 2D shows a side view of the crucible with hatching used to designate the cross-sectional view of FIG. 2B for illustrating preferred dimensions for the present invention crucible.

Referring to FIG. 2D, there is shown preferred dimensions for the present invention crucible. Preferably, the width W1 of the lip ridge is about from 0.05 to 0.07 inches; the width W2 of the rim to the crucible sidewall 36 is about 0.120 inches; and the width W3 of the bottom surface 32 is about 1.016 inches. The height H1 of the crucible from the bottom surface 32 to the lip ridge 44 is preferably about 1.068 inches; the height H2 from the bottom surface 32 to the rim perimeter 36 is preferably about 0.678 inches, such that the height H3 of the lip 42 is about 0.390 inches. Thus, the height H3 of the lip 42 is shown greater than fifty percent of the height H2 of the sidewall 34. The lip height H3 may vary depending upon the size and shape of the crucible and the amount of deposition material being evaporated, with the objective being that the lip height H3 be sufficient to prevent the spattering of deposition material out of the crucible during the evaporation process, as will be further explained below.

Referring still to FIG. 2D, the height H4 reflecting the thickness of the bottom surface 32, or the distance from the bottom surface 32 of the crucible to the reservoir 38, is preferably about 0.170 inches. As noted above, the lip 42 preferably is orientated above the rim 36, covering less than half of the rim's surface area. Preferably, the distance D1 shown in FIGS. 2A and 2D is about 0.183 inches; that is, when an imaginary radial line is drawn running through the center of the crucible (i.e., line 3—3 of FIG. 2A), D1 (about 0.183 inches), is the preferred distance between that line and the side edges of the lip 48*a*, 48*b*.

Referring to FIG. 2D, the bottom surface 32 of the crucible is disposed to rest along a substantially horizontal plane X. The sidewall 34 projects slightly outwardly away from the center of the crucible, such that an acute angle beta ($\beta$) is formed between the horizontal plane X and the sidewall. Preferably, this angle is approximately 79.5 degrees. The bottom of the reservoir 38 may be curved at the juncture of the bottom surface 32 and the sidewall 34, and the crucible further may be curved at the juncture of the lip 42 and the rim 36. The radius of curvature alpha ($\alpha$) is preferably about 0.125 radians.

Figure 3:
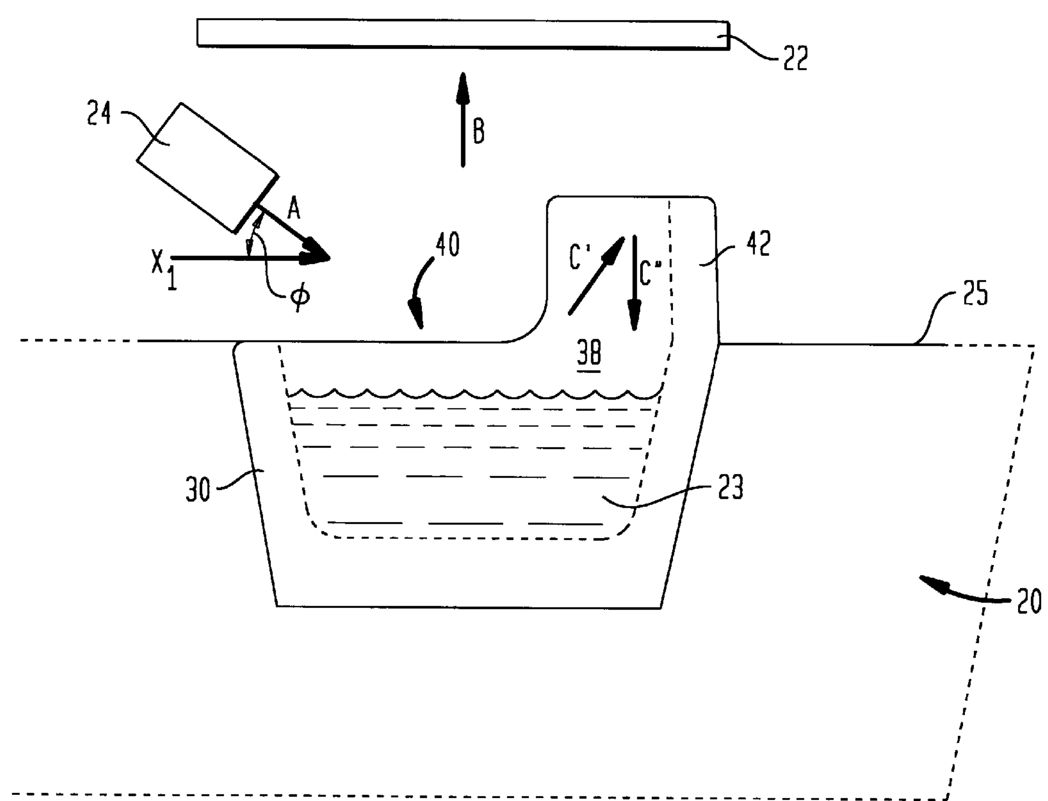
FIG. 3 shows the inventive method for performing electron-beam evaporation.

Referring now to FIG. 3, there is shown the present invention improved method for performing electron-beam evaporation. The crucible 30 as herein described is placed in an evaporator pot 20 such that the rim 36 is aligned with the top surface 25 of the evaporator pot 20. Thus, the lip 42 projects upwardly beyond the top surface 25 of the evaporator pot 20. A substrate 22, which is to be coated, is placed above the mouth 40 of the crucible reservoir 38. The metal 23 to be deposited on the substrate 22 is placed in the reservoir 38. An electron gun 24 is disposed above the reservoir and opposite the lip 42. The gun 24 is aimed to shoot a beam of electrons in the direction of arrow A into the metal 24 in the reservoir 38. The electron gun further should be aimed so that an acute angle phi ($\Phi$) is disposed between the beam of electrons and the substantially horizontal plane or axis X1, with the horizontal orientation of the electron beam directed toward the lip.

When this method is applied to perform the electron-beam evaporation process, the electrons emitted from the electron gun 24 cause the metal atoms to evaporate in the direction of arrow B to coat the surface of the substrate 22. The electron beam also causes metal atoms to spatter in the direction of arrow C'; however, the lip 42 shields the spattering atoms from coating the top surface 25 of the evaporator pot 20 with an unwanted layer of metal. Instead, the spattering materials are caused by the lip 42 to fall in the direction of arrow C", back into the reservoir 38 of the crucible. Thus, in contrast with the method as shown in FIG. 1A, no excess residue is accumulated on the top surface 25 of the evaporator pot 20, which remains clean, and deposition materials are not wasted.

The crucible may be fabricated with materials which are well known in the prior art. As is well known, the material used to fabricate the crucible may depend upon the deposition materials being used. For example, the crucible may be fabricated with intermetallic composites, such as titanium diboride and boron nitride, which could effectively be used when the deposition materials comprise aluminum. However, generally, such inter-metallic crucibles should not be used when the deposition materials comprise nickel, silicon, iron, silicon monoxide, silicon dioxide, cobalt, titanium, or other material that reacts with boron. Likewise, the present invention crucible may be fabricated with graphite, which would be especially useful if the deposition materials were to comprise gold, silver, or copper. Other materials that may be used to fabricate the crucible include molybdenum and vitreous carbon.

It will be understood that the embodiments described herein are merely exemplary and that a person skilled in the art may make variations and modifications without departing from the spirit and scope of the invention. All such variations and modifications are intended to be included within the scope of the appended claims.

We claim:

1. A crucible configured to be inserted in an evaporator pot having an upper surface for use in reducing the spattering of deposition material on the upper surface of the evaporator pot during an electron-beam evaporation process for coating a substrate with the deposition material, the crucible comprising:

a bottom and at least one sidewall extending upwardly from the bottom and terminating in a rim, wherein the inner surface of the sidewall and the bottom define a reservoir for containing the deposition material, the rim defines a mouth to the reservoir out of which the deposition material may evaporate, and the outer surface of the sidewall and bottom are configured so that the crucible may be inserted into the evaporator pot; and a lip attached to the rim and extending upwardly from a predetermined section of the rim, the lip being of a height sufficient so that, when the deposition material is placed in the reservoir and an electron beam is directed therein to cause the deposition material to evaporate onto the substrate, the lip will prevent the evaporating deposition material from spattering out of the mouth onto the upper surface of the evaporate or pot.

2. The crucible according to claim 1, in which the lip is integrally molded to the at least one sidewall.

3. The crucible according to claim 1, in which the bottom comprises a planar surface having a circular perimeter, the rim is circular with a circumference, and one sidewall extends upwardly from the perimeter of the bottom to the circumference of the rim to define a cup-shaped reservoir.

4. The crucible according to claim 3, in which the lip is arcuate and extends upwardly from less than half and more than one third of the rim circumference.

5. The crucible according to claim 4, in which the lip is substantially C-shaped.

6. An improved method for reducing spattering of deposition material onto an evaporator pot while performing an electron-beam evaporation process for coating a substrate with the deposition material of the type in which a crucible is inserted into the evaporator pot, wherein the improvement comprises:

(a) providing a crucible according to claim 1;

(b) placing the deposition material in the crucible and the crucible in the evaporator pot;

(c) disposing an electron gun above the crucible opposite the lip; and (d) directing a beam of electrons at the deposition material, the beam of electrons being generally disposed at an acute angle relative to the bottom surface of the crucible and horizontally orientated in the direction of the crucible lip so that the deposition material spatters toward the lip and is prevented by the lip from being emitted from the crucible onto the evaporator pot.

7. The method according to claim 6, further comprising the step of substantially aligning the rim of the crucible with the top surface of the evaporator pot so that the lip of the crucible projects upwardly above the top surface of the evaporator pot.

8. The method according to claim 7, wherein the step of providing the crucible comprises providing the crucible according to claim 6.

9. The method according to claim 7, wherein the step of providing the crucible comprises providing the crucible according to claim 7.

10. The method according to claim 6 in which the deposition material comprises a metal.

11. The method according to claim 6 in which the deposition material is selected from the group consisting of aluminum, gold, silver, copper, nickel, silicon, iron, silicon monoxide, silicon dioxide, cobalt, and titanium.

12. A crucible configured to be inserted in an evaporator pot having an upper surface for use in reducing the spattering of deposition material on the surface of the evaporator pot during an electron-beam evaporation process, the crucible comprising:

a planar bottom and a circular sidewall extending upwardly at an obtuse angle from the bottom to define a cup-shaped crucible having a circular upper rim, and a lip extending upwardly from less than half the rim circumference, the lip having an arcuate surface and a height sufficient so that, when the deposition material is placed in the crucible and an electron beam is directed therein, the lip will prevent the deposition material from spattering out of the crucible onto the upper surface of the evaporator pot.

13. The crucible according to claim 12, in which the lip has an upper C-shaped surface, an inner lip wall, and an outer lip wall, wherein the outer lip wall bends inward toward the center of the crucible such that an acute angle is disposed between the outer lip wall and the planar bottom.

14. The crucible according to claim 12, in which the obtuse angle is approximately 100 to 105 degrees.

15. The crucible according to claim 12, in which the planar bottom is circular having a diameter of about 1.016 inches; the sidewall has a height relative to the bottom of about 0.678 inches; and the lip has a height relative to the rim of about 0.390 inches.

* * * * *